(12) United States Patent
Zhao (10) Patent No.: US 11,915,623 B2
(45) Date of Patent: Feb. 27, 2024

(54) FLEXIBLE DISPLAY PANEL, MANUFACTURING METHOD THEREOF, AND FLEXIBLE DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventor: Kang Zhao, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 723 days.

(21) Appl. No.: 16/964,252

(22) PCT Filed: Jun. 19, 2020

(86) PCT No.: PCT/CN2020/096949
§ 371 (c)(1),
(2) Date: Jul. 23, 2020

(87) PCT Pub. No.: WO2021/248541
PCT Pub. Date: Dec. 16, 2021

(65) Prior Publication Data
US 2021/0383728 A1    Dec. 9, 2021

(30) Foreign Application Priority Data
Jun. 9, 2020    (CN) .......................... 202010517110.0

(51) Int. Cl.
*G09F 9/30*    (2006.01)
*G02B 5/30*    (2006.01)
(Continued)

(52) U.S. Cl.
CPC ................ *G09F 9/301* (2013.01); *B32B 3/18* (2013.01); *B32B 7/12* (2013.01); *B32B 15/04* (2013.01);
(Continued)

(58) Field of Classification Search
CPC .. B32B 3/18; B32B 7/12; B32B 15/04; B32B 37/02; B32B 37/12; B32B 38/10; B32B 2457/20; G02B 5/3025; G09F 9/301
See application file for complete search history.

(56) References Cited

U.S. PATENT DOCUMENTS

2008/0067913 A1    3/2008  Onishi
2018/0013079 A1    1/2018  Cai
(Continued)

FOREIGN PATENT DOCUMENTS

CN    100428501 C    10/2008
CN    104934438 A    9/2015
(Continued)

OTHER PUBLICATIONS

Machine Translation of CN 210627728 U (Year: 2020).*
Machine Translation of CN 111131563 A (Year: 2020).*

*Primary Examiner* — Christopher M Polley
*Assistant Examiner* — Sathavaram I Reddy
(74) *Attorney, Agent, or Firm* — PV IP PC; Wei Te Chung; Zhigang Ma (57) ABSTRACT

A flexible display module, a manufacturing method thereof, and a flexible display device are provided. The flexible display module includes a flexible display panel; a back plate, a buffer material layer, a first adhesive layer, and a metal plate under the flexible display panel; a polarizer, a second adhesive layer, and a cover plate on the flexible display panel. The back plate is positioned in a non-bending area. The buffer material layer is positioned in a bending area and is disposed in a same layer as the back plate. A side of the first adhesive layer is bonded to the back plate and the buffer material layer, and another side thereof is bonded to the metal plate.

16 Claims, 3 Drawing Sheets

(51) Int. Cl.
 *B32B 3/18* (2006.01)
 *B32B 7/12* (2006.01)
 *B32B 15/04* (2006.01)
 *B32B 37/02* (2006.01)
 *B32B 37/12* (2006.01)
 *B32B 38/10* (2006.01)
(52) U.S. Cl.
 CPC .............. *B32B 37/02* (2013.01); *B32B 37/12* (2013.01); *B32B 38/10* (2013.01); *G02B 5/3025* (2013.01); *B32B 2457/20* (2013.01)

(56) References Cited

U.S. PATENT DOCUMENTS

| | | | |
|---|---|---|---|
| 2020/0052248 | A1 | 2/2020 | Cho et al. |
| 2021/0091319 | A1 | 3/2021 | Yang et al. |

FOREIGN PATENT DOCUMENTS

| | | | |
|---|---|---|---|
| CN | 106652802 | A | 5/2017 |
| CN | 107067979 | A | 8/2017 |
| CN | 108986671 | A | 12/2018 |
| CN | 110164315 | A | 8/2019 |
| CN | 110570764 | A | 12/2019 |
| CN | 110718558 | A | 1/2020 |
| CN | 111131563 | A | 5/2020 |
| CN | 210627728 | U | 5/2020 |

\* cited by examiner

FLEXIBLE DISPLAY PANEL, MANUFACTURING METHOD THEREOF, AND FLEXIBLE DISPLAY DEVICE

FIELD OF INVENTION

The present application relates to the field of display technologies, and more particularly to a display panel, a manufacturing method thereof, and a flexible display device.

BACKGROUND OF INVENTION

With the continuous innovation of technology in the display panel industry, flexible display panels have developed into one of key technologies in the display field due to many advantages such as thinness, flexibility, foldability, and power saving.

Figure 1:
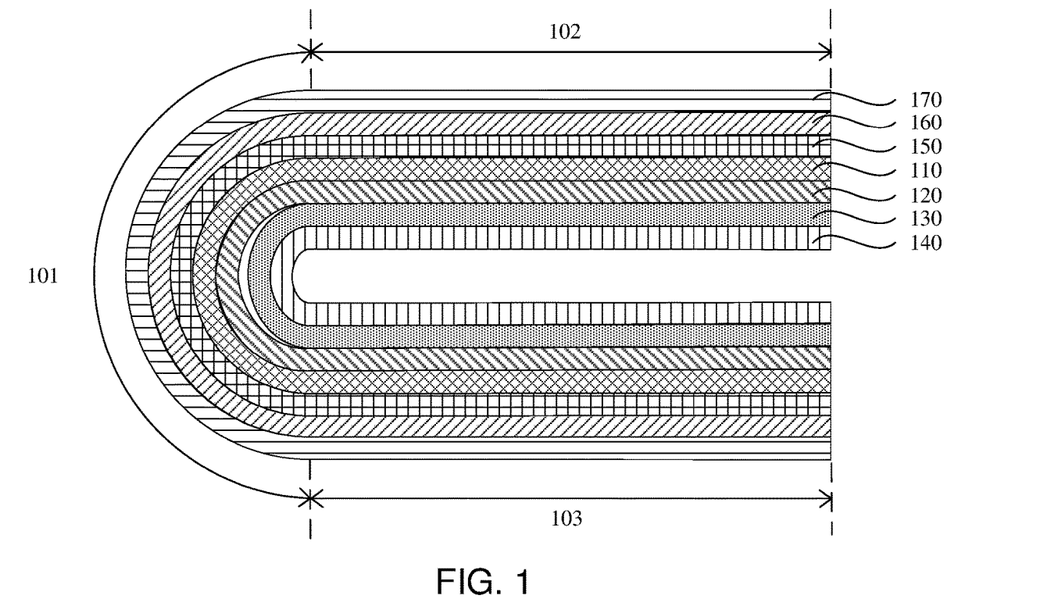
FIG. 1 is a schematic structural diagram of a flexible display module in the prior art.

Bending life of a flexible bending screen is affected by a stack structure and material of a display module. Referring to FIG. 1, which is a schematic diagram of a structure of a current bending screen. Materials of a back plate 120 and a metal plate 140 are both hard materials. Material of a first adhesive layer 130 comprises an organic adhesive material. Viscosity between the first adhesive layer 130 and the back plate 120 is small. Bending coefficient of the back plate 120 and the metal plate 140 are different. Therefore, when the number of times the screen bends reaches a certain value, the metal plate 140 is easily peeled off from the first adhesive layer 130.

Therefore, a current flexible display device has an issue of peeling of the metal plate in a bending area, which needs to be solved.

SUMMARY OF INVENTION

The present application provides a flexible display panel, a manufacturing method thereof, and a flexible display device, to improve a current flexible display device having an issue of peeling of a metal plate in a bending area.

The present application provides a flexible display module comprising a flexible display panel; a back plate, a buffer material layer, a first adhesive layer, and a metal plate sequentially disposed under the flexible display panel; a polarizer, a second adhesive layer, and a cover plate sequentially disposed on the flexible display panel; wherein the back plate is positioned in a non-bending area and is configured to support the flexible display panel in the non-bending area; the buffer material layer is positioned in a bending area and is disposed in a same layer as the back plate; a side of the first adhesive layer is bonded to the back plate and the buffer material layer, and another side of the first adhesive layer is bonded to the metal plate.

The flexible display module according to the present application, a thickness of the buffer material layer is same as a thickness of the back plate.

The flexible display module according to the present application, material of the buffer material layer is different from material of the first adhesive layer.

The flexible display module according to the present application, the material of the buffer material layer comprises rubber and polymer resin.

The flexible display module according to the present application, material of the buffer material layer is same as material of the first adhesive layer.

The flexible display module according to the present application, material of the first adhesive layer comprises an optical adhesive.

The flexible display module according to the present application, the buffer material layer and the first adhesive layer are integrally formed.

The flexible display module according to the present application, wherein the buffer material layer and the first adhesive layer are separately formed.

The present application provides a manufacturing method of a flexible display module comprising forming a flexible display panel; sequentially forming a back plate, a buffer material layer, a first adhesive layer, and a metal plate under the flexible display panel; the back plate is positioned in a non-bending area and is configured to support the flexible display panel in the non-bending area; the buffer material layer is positioned in a bending area and is disposed in a same layer as the back plate; a side of the first adhesive layer is bonded to the back plate and the buffer material layer, and another side of the first adhesive layer is bonded to the metal plate; and sequentially forming a polarizer, a second adhesive layer, and a cover plate on the flexible display panel.

The manufacturing method according to the present application, a step of sequentially forming the back plate, the first adhesive layer, and the metal plate under the flexible display panel comprises forming the back plate under the flexible display panel in the non-bending area; forming the first adhesive layer under the flexible display panel in the bending area and under the back plate; and forming the metal plate under the first adhesive layer.

The manufacturing method according to the present application, a step of forming the back plate under the flexible display panel in the non-bending area comprises fitting the back plate under the flexible display panel; cutting the back plate along a boundary line between the non-bending area and the bending area; and removing the back plate in the bending area and retaining the back plate in the non-bending area.

The manufacturing method according to the present application, a step of forming the first adhesive layer under the flexible display panel in the bending area and under the back plate comprises forming a first adhesive part of the first adhesive layer under the flexible display panel in the bending area; and forming a second adhesive part of the first adhesive layer under the first adhesive part and the back plate.

The manufacturing method according to the present application, a step of forming the first adhesive layer under the flexible display panel in the bending area and under the back plate comprises laminating the first adhesive layer under the flexible display panel in the bending area and under the back plate; wherein the first adhesive layer is bonded to the flexible display panel in the bending area and the back plate.

In addition, the present application further provides a flexible display device comprising the flexible display module as described above, the flexible display module comprises a flexible display panel; a back plate, a buffer material layer, a first adhesive layer, and a metal plate sequentially disposed under the flexible display panel; a polarizer, a second adhesive layer, and a cover plate sequentially disposed on the flexible display panel; wherein the back plate is positioned in a non-bending area and is configured to support the flexible display panel in the non-bending area; the buffer material layer is positioned in a bending area and is disposed in a same layer as the back plate; a side of the first adhesive layer is bonded to the back plate and the buffer material layer, and another side of the first adhesive layer is bonded to the metal plate.

The flexible display device according to the present application, a thickness of the buffer material layer is same as a thickness of the back plate.

The flexible display device according to the present application, material of the buffer material layer is different from material of the first adhesive layer.

The flexible display device according to the present application, material of the buffer material layer is same as material of the first adhesive layer.

The flexible display device according to the present application, material of the first adhesive layer comprises an optical adhesive.

The flexible display device according to the present application, the buffer material layer and the first adhesive layer are integrally formed.

The flexible display device according to the present application, the buffer material layer and the first adhesive layer are separately formed.

Beneficial effect:

The present application provides a flexible display module, a manufacturing method thereof, and a flexible display device. The flexible display module comprises a flexible display panel; a back plate, a buffer material layer, a first adhesive layer, and a metal plate sequentially disposed under the flexible display panel; a polarizer, a second adhesive layer, and a cover plate sequentially disposed on the flexible display panel; wherein the back plate is positioned in a non-bending area and is configured to support the flexible display panel in the non-bending area; the buffer material layer is positioned in a bending area and is disposed in a same layer as the back plate; a side of the first adhesive layer is bonded to the back plate and the buffer material layer, and another side of the first adhesive layer is bonded to the metal plate. By providing the back plate in the non-bending area under the flexible display panel, the buffer material layer is disposed in the bending area under the flexible display panel, and the back plate is replaced with the buffer material layer. There is no difference in a bending coefficient between the back plate and the metal plate in the bending area. The buffer material layer has better bending resistance than the back plate. When the flexible display module is bent along the bending area, the buffer material layer buffers a bending stress. This alleviates an issue of peeling of the metal plate and the back plate in the bending area in the prior art.

DESCRIPTION OF DRAWINGS

Technical solutions and other beneficial effects of the present application will be apparent through the detailed description of the specific implementation of the present application in conjunction with the accompanying drawings.

DETAILED DESCRIPTION OF PREFERRED EMBODIMENTS

In view of an issue that a current flexible display device has a peeling of a metal plate in a bending area, an embodiment of the present application provides a flexible display module to alleviate this issue.

In an embodiment, as illustrated in FIG. 2 to FIG. 5, a flexible display module provided by the present application includes a bending area 201 and a non-bending area (202, 203). In the bending area 201, the flexible display module includes a flexible display panel 210; a back plate 220, a buffer material layer 230, a first adhesive layer 240, and a metal plate 250 sequentially disposed under the flexible display panel 210; a polarizer 260, a second adhesive layer 270, and a cover plate 280 sequentially disposed on the flexible display panel. The back plate 220 is positioned in a non-bending area (202, 203) and is configured to support the flexible display panel 210 in the non-bending area (202, 203). The buffer material layer 230 is positioned in a bending area 201 and is disposed in a same layer as the back plate 220. A side of the first adhesive layer 240 is bonded to the back plate 220 and the buffer material layer 230, and another side of the first adhesive layer 240 is bonded to the metal plate 250.

An embodiment of the present application provides a flexible display module. The flexible display module is provided with a back plate in a non-bending area under a flexible display panel, a buffer material layer is disposed in a bending area, and the back plate is disposed under the back plate and the buffer material layer. The back plate is replaced with the buffer material layer in the bending area. There is no difference in a bending coefficient between the back plate and the metal plate. The buffer material layer has better bending resistance than the back plate. When the flexible display module is bent along the bending area, the buffer material layer buffers a bending stress. This alleviates an issue of peeling of the metal plate and the back plate in the bending area in the prior art.

The flexible display panel 210 generally includes a flexible substrate, a driving circuit layer, and a light emitting functional layer. For details, reference may be made to the flexible display panel in the prior art, and details are not described herein again.

The back plate 220 includes a first back plate 221 and a second back plate 222. The first back plate 221 is positioned in the non-bending area 202. The second back plate 222 is positioned in the non-bending area 203. The back plate 220 is generally a hard substrate for supporting the flexible display panel 210, the material thereof can be an inorganic material, such as a glass material or a metal material (aluminum alloy, stainless steel, etc.), or an organic material, such as a hard plastic.

A first adhesive layer 240 is configured to bond the back plate 220 and the metal plate 250. The first adhesive layer 240 is generally an optical adhesive layer. Optical adhesive has characteristics of colorless and transparent, light transmittance of more than 90%, good bonding strength, and small curing shrinkage at room temperature or intermediate temperature. The optical adhesive can efficiently bond the back plate 220 and the metal plate 250 together. The material of the optical adhesive layer includes polymethyl methacrylate and epoxy acrylate.

The metal plate 250 is configured to strengthen a structure of the flexible display module and is also configured to dissipate heat from the display panel. The material of the metal plate 250 includes metallic copper, aluminum alloy, stainless steel, and the like.

The second adhesive layer 270 has the same function as the first adhesive layer 240 and is configured to bond the polarizer 260 and the cover plate 280. The material of the second adhesive layer 270 is similar to the material of the first adhesive layer 240.

The cover plate 280 is configured to protect the flexible display panel 210 from external water, oxygen, foreign particles, etc. entering the flexible display module. The cover plate is generally a glass or transparent organic hard substrate.

The buffer material layer 230 is formed from a buffer material. The buffer material layer 230 is positioned in the bending area 201 between the first back plate 221 and the second back plate 222. A thickness of the buffer material layer 230 is same as a thickness of the back plate 220. When the flexible display module is bent along the bending area, the buffer material layer 230 provides a stress buffering channel for the flexible display module.

Figure 2:
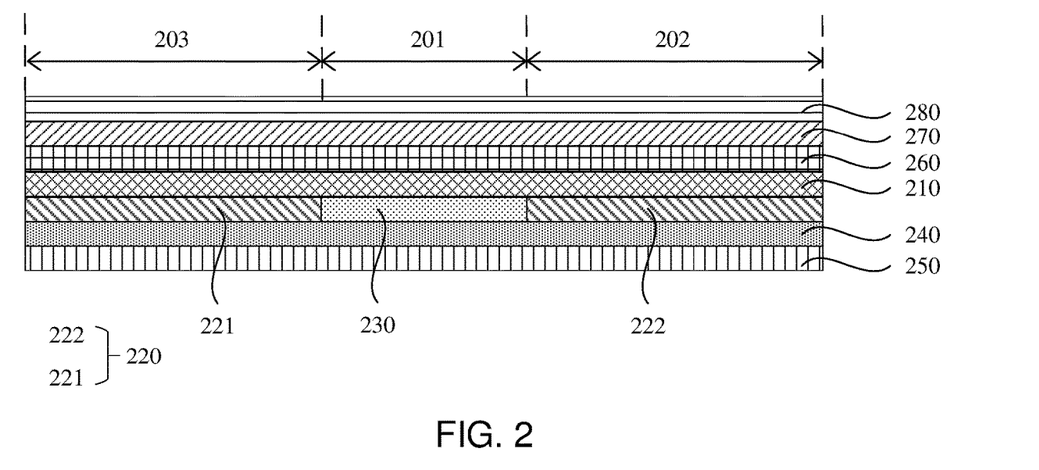
FIG. 2 is a schematic diagram of a first structure of a flexible display module in an unfolded state provided in an embodiment of the present application.
Figure 3:
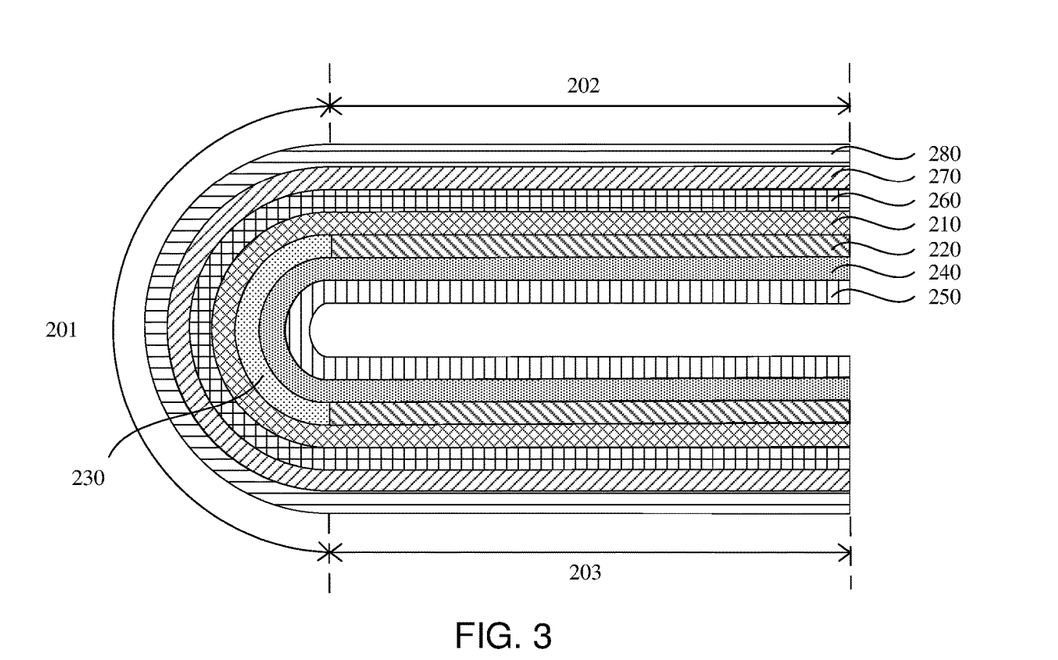
FIG. 3 is a schematic diagram of a first structure of a flexible display module in a bent state provided in an embodiment of the present application.

In one embodiment, material of the buffer material layer 230 is different from material of the first adhesive layer 240. The buffer material layer 230 is made of material with buffer properties and can effectively absorb and release bending stress. The material of the buffer material layer 230 includes, but is not limited to, urethane rubber, acrylic material, and epoxy material. As illustrated in FIG. 2 and FIG. 3, the buffer material layer 230 and the first adhesive layer 240 are separately formed. That is, in the manufacturing process of the flexible display module, the buffer material layer 230 is formed first, and then the first adhesive layer 240 is formed.

Compared with the prior art in the embodiment, the back plate in the bending area is replaced by the buffer material layer 230, therefore, there is no difference in the bending coefficient between the back plate and the metal plate in the bending area. In addition, the buffer material layer 230 is made of rubber or polymer resin-based organic material and has higher viscosity with the first adhesive layer 240 than between the back plate 220 and the first adhesive layer 240. As illustrated in FIG. 3, when the flexible display module is bent along the bending area 201, the buffer material layer 230 provides a buffer space for bending stress. This alleviates an issue of peeling of the metal plate and the back plate in the bending area in the prior art.

In the embodiment, the material of the buffer material layer 230 is different from the material of the first adhesive layer 240. The buffer material layer 230 and the first adhesive layer 240 are formed separately. The buffer material layer 230 can be formed by selecting material that better meets bending performance requirements according to specific bending needs. Moreover, the buffer material layer 230 is separately formed, and the manufacturing process is more controllable.

Figure 4:
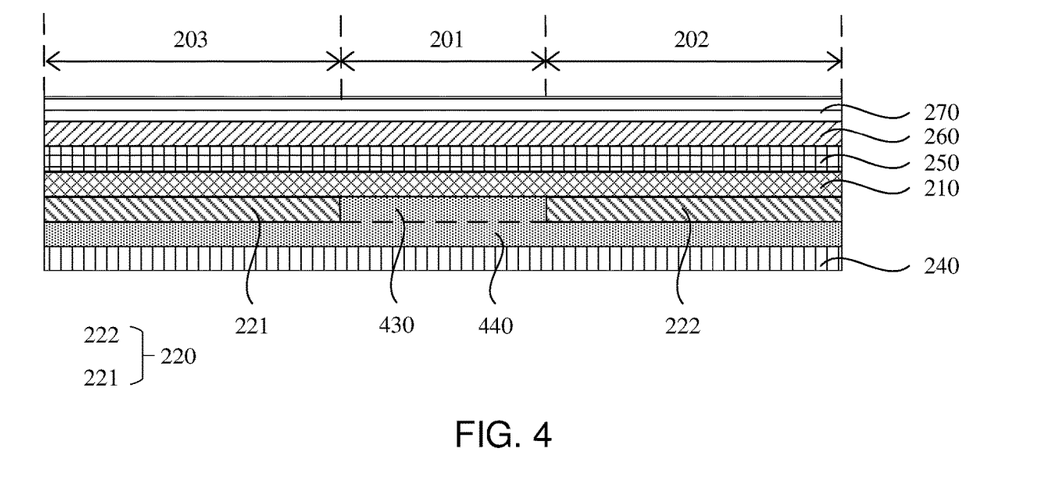
FIG. 4 is a schematic diagram of a second structure of a flexible display module in an expanded state provided in an embodiment of the present application.

In another embodiment, as illustrated in FIG. 2 or FIG. 4, material of the buffer material layer (230, 430) is same as material of the first adhesive layer (240, 440). The buffer material layer (230, 430) is also an optical adhesive material and has a function of bonding other film layers. An upper side of the buffer material layer (230, 430) is bonded to the flexible display panel 210. A lower side of the buffer material layer (230, 430) is bonded to the first adhesive layer (240, 440). A left side of the buffer material layer (230, 430) is bonded to the first back plate 221. A right side of the buffer material layer (230, 430) is bonded to the second back plate 222.

Figure 5:
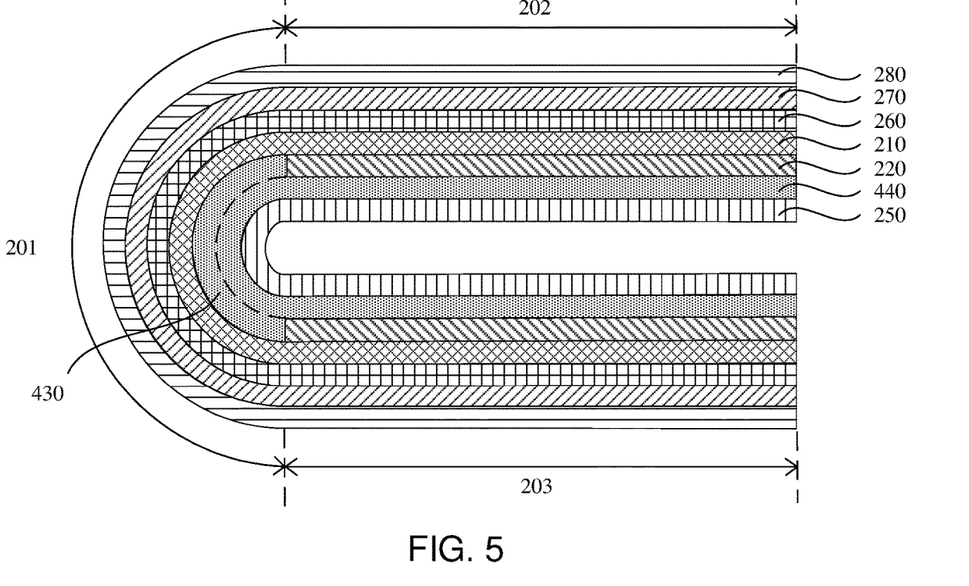
FIG. 5 is a schematic diagram of a second structure of a flexible display module in a bent state provided in an embodiment of the present application.

Compared with the previous embodiment, the buffer material layer (230, 430) uses the same optical adhesive material as the first adhesive layer 240. This makes an adhesive performance between the buffer material layer (230, 430) and the flexible display panel 210, and between the buffer material layer (230, 430) and the first adhesive layer (240, 440) stronger. This is more advantageous to prevent a risk of mutual peeling between the buffer material layer (230, 430) and the flexible display panel 210, and between the buffer material layer (230, 430) and the first adhesive layer (240, 440). In addition, as an organic material, optical adhesive has good fluidity and bending resistance. When the flexible display module is bent along the bending area, as illustrated in FIG. 3 and FIG. 5, the buffer material layer (230, 430) provide buffer space for bending stress. This more effectively alleviates an issue of peeling of the metal plate and the back plate in the bending area in the prior art.

In one embodiment, as illustrated in FIG. 2 and FIG. 3, the buffer material layer 230 and the first adhesive layer 240 are separately formed. That is, in the manufacturing process of the flexible display module, the buffer material layer 230 is formed first, and then the first adhesive layer 240 is formed. The buffer material layer 230 and the first adhesive layer 240 are formed separately. The buffer material layer 230 is formed separately, and can be formed by a suitable manufacturing process, which is more controllable.

In another embodiment, as illustrated in FIG. 4 and FIG. 5, the buffer material layer 430 and the first adhesive layer 440 are integrally formed. That is, in the manufacturing process of the flexible display module, the buffer material layer 430 and the first adhesive layer 440 are simultaneously formed. The manufacturing methods of the buffer material layer 430 and the first adhesive layer 440 include, but are not limited to, 3D printing, computerized numerical control (CNC) processing, and the like.

Figure 6:
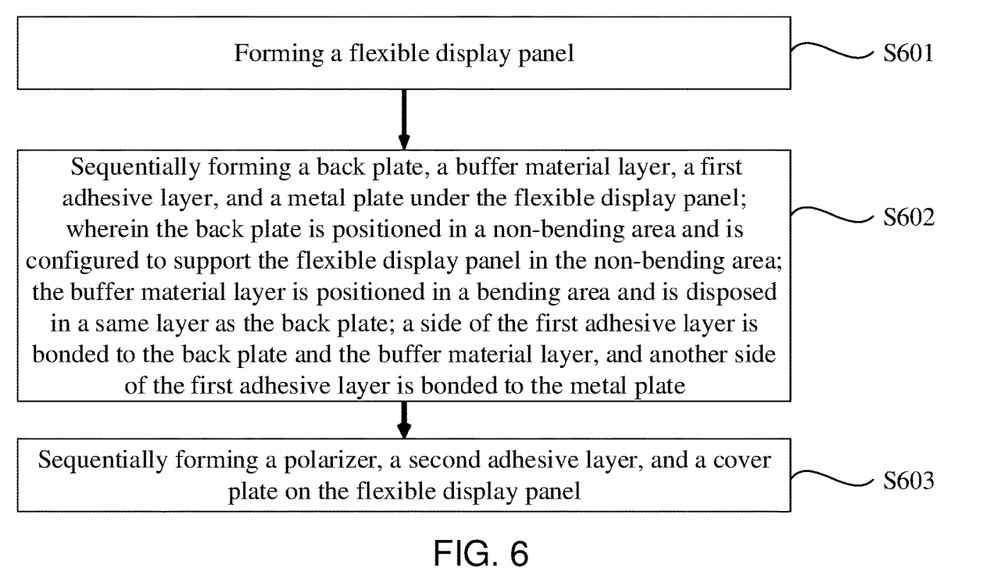
FIG. 6 is a manufacturing flowchart of a flexible display module provided by an embodiment of the present application.

In addition, the present application provides a method of manufacturing a flexible display module, which is used to form the above flexible display module. As illustrated in FIG. 6, the manufacturing method includes:

Step S601: forming a flexible display panel.

Step S602: sequentially forming a back plate, a buffer material layer, a first adhesive layer, and a metal plate under the flexible display panel; wherein the back plate is positioned in a non-bending area and is configured to support the flexible display panel in the non-bending area; the buffer material layer is positioned in a bending area and is disposed in a same layer as the back plate; a side of the first adhesive layer is bonded to the back plate and the buffer material layer, and another side of the first adhesive layer is bonded to the metal plate.

Step S603: sequentially forming a polarizer, a second adhesive layer, and a cover plate on the flexible display panel.

The embodiment provides a method of manufacturing a flexible display module. The manufacturing method is to form a back plate in a non-bending area under a flexible display panel. A buffer material layer is formed in a bending area under the flexible display panel. Replace the back plate with the buffer material layer. There is no difference in the bending coefficient between the back plate and the metal plate in the bending area. The buffer material layer has better bending resistance than the back plate. When the flexible display module is bent along the bending area, the buffer material layer buffers a bending stress. This alleviates an issue of peeling of the metal plate and the back plate in the bending area in the prior art.

In the step S601, a flexible display panel is formed. The flexible display panel can be formed by using the existing technology, which is not limited herein.

The step S602 of sequentially forming the back plate, the buffer material layer, the first adhesive layer, and the metal plate under the flexible display panel comprises:

Step S6021: forming the back plate under the flexible display panel in the non-bending area comprises fitting the back plate under the flexible display panel; cutting the back plate along a boundary line between the non-bending area and the bending area using a laser cutting process; and removing the back plate in the bending area and retaining the back plate in the non-bending area.

Step S6022: forming a buffer material layer and a first adhesive layer under the display panel and the back plate.

In one embodiment, first, a buffer material layer is formed in the bending area under the flexible display panel. The thickness of the buffer material layer is the same as the thickness of the back plate. The upper surface of the buffer material layer is in contact with the lower surface of the flexible display panel. The lower surface of the buffer material layer is flush with the lower surface of the back plate. The left and right sides of the buffer material layer are in contact with the back plate respectively. The buffer material layer may be directly formed in the bending area of the lower surface of the flexible display panel by using inkjet printing, spraying method, or chemical vapor deposition process. Alternatively, a buffer material layer having the same plane size as the bending area and the same thickness as the back plate may be formed, and then the buffer material layer is attached to the bending area under the flexible display panel. Then, under the buffer material layer and the back plate, the first adhesive layer is pasted.

In the embodiment, the buffer material layer and the first adhesive layer are formed separately. That is, the buffer material layer is first formed in the bending area under the flexible display panel, and then the first adhesive layer is bonded under the buffer material layer and the back plate. The buffer material layer is separately formed, and a suitable process method can be selected according to the material of the buffer material layer. The manufacturing process is simpler and controllable.

In another embodiment, first, the buffer material layer and the first adhesive layer are formed in one piece by means of 3D printing and CNC processing. The material of the buffer material layer and the first adhesive layer are the same. A plane size of the buffer material layer is the same as a plane size of the bending area. The thickness of the buffer material layer is the same as the thickness of the back plate. A position of the buffer material layer on the first adhesive layer is a position of the corresponding bending area after the first adhesive layer and the back plate are pasted. Then, the buffer material layer and the first adhesive layer are bonded under the flexible display panel and the back plate in the bending area. It should be noted in this process that the buffer material layer and the bending area are accurately positioned to ensure that the buffer material layer can be accurately bonded to the lower surface of the flexible display panel in the bending area.

In the embodiment, the buffer material layer and the first adhesive layer need to be formed by integral molding, and then be aligned with the flexible display panel and the back plate, which requires higher precision in the manufacturing process.

Step S6023: forming a metal plate under the first adhesive layer and bonding the metal plate and the first adhesive layer in alignment.

In addition, the present application also provides a flexible display device. The flexible display device includes a flexible display module. The flexible display module includes a flexible display panel; a back plate, a buffer material layer, a first adhesive layer, and a metal plate sequentially disposed under the flexible display panel; a polarizer, a second adhesive layer, and a cover plate sequentially disposed on the flexible display panel; wherein the back plate is positioned in a non-bending area and is configured to support the flexible display panel in the non-bending area; the buffer material layer is positioned in a bending area and is disposed in a same layer as the back plate; a side of the first adhesive layer is bonded to the back plate and the buffer material layer, and another side of the first adhesive layer is bonded to the metal plate.

The embodiment provides a flexible display device. The flexible display device includes a flexible display module. The flexible display module is provided with a back plate in a non-bending area under a flexible display panel. A buffer material layer is provided in a bending area. A metal plate is provided under the back plate and the buffer material layer. The back plate is replaced with a buffer material layer in the bending area, and there is no difference in bending coefficient between the back plate and the metal plate. The buffer material layer has better bending resistance than the back plate. When the flexible display module is bent along the bending area, the buffer material layer buffers the bending stress. This alleviates an issue of peeling of the metal plate and the back plate in the bending area in the prior art.

In one embodiment, a thickness of the buffer material layer is same as a thickness of the back plate.

In one embodiment, material of the buffer material layer is different from material of the first adhesive layer.

In one embodiment, material of the buffer material layer comprises rubber and polymer resin.

In one embodiment, material of the buffer material layer is same as material of the first adhesive layer.

In one embodiment, material of the first adhesive layer comprises an optical adhesive.

In one embodiment, the buffer material layer and the first adhesive layer are integrally formed.

In one embodiment, the buffer material layer and the first adhesive layer are separately formed.

According to the above embodiment:

The present application provides a flexible display module, a manufacturing method thereof, and a flexible display device. The flexible display module comprises a flexible display panel; a back plate, a buffer material layer, a first adhesive layer, and a metal plate sequentially disposed under the flexible display panel; a polarizer, a second adhesive layer, and a cover plate sequentially disposed on the flexible display panel; wherein the back plate is positioned in a non-bending area and is configured to support the flexible display panel in the non-bending area; the buffer material layer is positioned in a bending area and is disposed in a same layer as the back plate; a side of the first adhesive layer is bonded to the back plate and the buffer material layer, and another side of the first adhesive layer is bonded to the metal plate. By providing the back plate in the non-bending area under the flexible display panel, the buffer material layer is disposed in the bending area under the flexible display panel, and the back plate is replaced with the buffer material layer. There is no difference in a bending coefficient between the back plate and the metal plate in the bending area. The buffer material layer has better bending resistance than the back plate. When the flexible display module is bent along the bending area, the buffer material layer buffers a bending stress. This alleviates an issue of peeling of the metal plate and the back plate in the bending area in the prior art.

In summary, although the present application has been disclosed as above with preferred embodiments, the above preferred embodiments are not intended to limit the present application. Those of ordinary skill in the art can make various changes and modifications without departing from the spirit and scope of the present application. Therefore, the protection scope of the present application is subject to the scope defined by the claims.

What is claimed is:

1. A flexible display module, comprising:
    a flexible display panel;
    a back plate, a buffer material layer, a first adhesive layer, and a metal plate sequentially disposed under the flexible display panel;
    a polarizer, a second adhesive layer, and a cover plate sequentially disposed on the flexible display panel;
    wherein the back plate is positioned in a non-bending area and is configured to support the flexible display panel in the non-bending area; the buffer material layer is positioned in a bending area and is disposed in a same layer as the back plate; a side of the first adhesive layer is bonded to the back plate and the buffer material layer, and another side of the first adhesive layer is bonded to the metal plate;
    wherein an adhesion between the buffer material layer and the first adhesive layer is greater than an adhesion between the back plate and the first adhesive layer and wherein the material of the buffer material layer is different from material of the first adhesive layer.

2. The flexible display module according to claim 1, wherein a thickness of the buffer material layer is same as a thickness of the back plate.

3. The flexible display module according to claim 1, wherein the material of the buffer material layer comprises rubber and polymer resin.

4. The flexible display module according to claim 1, wherein material of the first adhesive layer comprises an optical adhesive.

5. The flexible display module according to claim 2, wherein the buffer material layer and the first adhesive layer are integrally formed.

6. The flexible display module according to claim 2, wherein the buffer material layer and the first adhesive layer are separately formed.

7. A manufacturing method of a flexible display module, comprising:
    forming a flexible display panel;
    sequentially forming a back plate, a buffer material layer, a first adhesive layer, and a metal plate under the flexible display panel; the back plate is positioned in a non-bending area and is configured to support the flexible display panel in the non-bending area; the buffer material layer is positioned in a bending area and is disposed in a same layer as the back plate; a side of the first adhesive layer is bonded to the back plate and the buffer material layer, and another side of the first adhesive layer is bonded to the metal plate; and
    sequentially forming a polarizer, a second adhesive layer, and a cover plate on the flexible display panel
    wherein an adhesion between the buffer material layer and the first adhesive layer is greater than an adhesion between the back plate and the first adhesive layer and wherein the material of the buffer material layer is different from material of the first adhesive layer.

8. The manufacturing method according to claim 7, wherein a step of sequentially forming the back plate, the first adhesive layer, and the metal plate under the flexible display panel comprises:
    forming the back plate under the flexible display panel in the non-bending area;
    forming the first adhesive layer under the flexible display panel in the bending area and under the back plate; and
    forming the metal plate under the first adhesive layer.

9. The manufacturing method according to claim 8, wherein a step of forming the back plate under the flexible display panel in the non-bending area comprises:
    fitting the back plate under the flexible display panel;
    cutting the back plate along a boundary line between the non-bending area and the bending area; and
    removing the back plate in the bending area and retaining the back plate in the non-bending area.

10. The manufacturing method according to claim 9, wherein a step of forming the first adhesive layer under the flexible display panel in the bending area and under the back plate comprises:
    forming a first adhesive part of the first adhesive layer under the flexible display panel in the bending area; and
    forming a second adhesive part of the first adhesive layer under the first adhesive part and the back plate.

11. The manufacturing method according to claim 9, wherein a step of forming the first adhesive layer under the flexible display panel in the bending area and under the back plate comprises:
    laminating the first adhesive layer under the flexible display panel in the bending area and under the back plate; wherein the first adhesive layer is bonded to the flexible display panel in the bending area and the back plate.

12. A flexible display device comprising a flexible display module, the flexible display module comprising:
    a flexible display panel;
    a back plate, a buffer material layer, a first adhesive layer, and a metal plate sequentially disposed under the flexible display panel;
    a polarizer, a second adhesive layer, and a cover plate sequentially disposed on the flexible display panel;
    wherein the back plate is positioned in a non-bending area and is configured to support the flexible display panel in the non-bending area; the buffer material layer is positioned in a bending area and is disposed in a same layer as the back plate; a side of the first adhesive layer is bonded to the back plate and the buffer material layer, and another side of the first adhesive layer is bonded to the metal plate
    wherein an adhesion between the buffer material layer and the first adhesive layer is greater than an adhesion between the back plate and the first adhesive layer and wherein the material of the buffer material layer is different from material of the first adhesive layer.

13. The flexible display device according to claim 12, wherein a thickness of the buffer material layer is same as a thickness of the back plate.

14. The flexible display device according to claim 12, wherein material of the first adhesive layer comprises an optical adhesive.

15. The flexible display device according to claim 14, wherein the buffer material layer and the first adhesive layer are integrally formed.

16. The flexible display device according to claim 14, wherein the buffer material layer and the first adhesive layer are separately formed.

\* \* \* \* \*